United States Patent
Behles et al.

(10) Patent No.: US 10,405,077 B2
(45) Date of Patent: *Sep. 3, 2019

(54) SPEAKER APPARATUS

(71) Applicant: Nokia Technologies Oy, Espoo (FI)

(72) Inventors: Thorsten Behles, Tampere (FI); Pasi Kemppinen, Tampere (FI); Mikko Jyrkinen, Tampere (FI)

(73) Assignee: Nokia Technologies Oy, Espoo (FI)

( * ) Notice: Subject to any disclaimer, the term of this patent is extended or adjusted under 35 U.S.C. 154(b) by 0 days.

This patent is subject to a terminal disclaimer.

(21) Appl. No.: 16/022,869

(22) Filed: Jun. 29, 2018

(65) Prior Publication Data

US 2019/0082248 A1 Mar. 14, 2019

Related U.S. Application Data

(63) Continuation of application No. 14/654,932, filed as application No. PCT/FI2014/050006 on Jan. 7, 2014, now Pat. No. 10,142,717.

(30) Foreign Application Priority Data

Jan. 7, 2013 (GB) .................................. 1300229.0

(51) Int. Cl.
| | |
|---|---|
| *H04R 1/02* | (2006.01) |
| *G02F 1/1333* | (2006.01) |
| *H04M 1/03* | (2006.01) |
| *H04R 7/04* | (2006.01) |
| *H01L 41/09* | (2006.01) |
| *H04R 7/20* | (2006.01) |
| *G06F 3/01* | (2006.01) |

(Continued)

(52) U.S. Cl.
CPC ........... *H04R 1/028* (2013.01); *G02F 1/1333* (2013.01); *G06F 1/1626* (2013.01); *G06F 1/1637* (2013.01); *G06F 1/1643* (2013.01); *G06F 1/1688* (2013.01); *G06F 3/016* (2013.01); *G06F 3/041* (2013.01); *H01L 41/0973* (2013.01); *H04M 1/03* (2013.01); *H04R 7/04* (2013.01); *H04R 7/20* (2013.01); *G02F 2001/133394* (2013.01); *H04R 1/2819* (2013.01); *H04R 17/00* (2013.01); *H04R 2201/029* (2013.01); *H04R 2400/03* (2013.01); *H04R 2499/11* (2013.01); *H04R 2499/15* (2013.01)

(58) Field of Classification Search
CPC ..... H04R 1/028; G02F 1/1333; G06F 1/1626; G06F 1/1637; G06F 1/1643; G06F 1/1688; H01L 41/0973
USPC ....... 381/300, 59, 85, 89, 332–336, 96, 111, 381/116, 117, 386, 431; 709/250
See application file for complete search history.

(56) References Cited

U.S. PATENT DOCUMENTS

2006/0140438 A1 6/2006 Kimura
2006/0140439 A1 6/2006 Nakagawa
(Continued)

FOREIGN PATENT DOCUMENTS

CN 102349035 A 2/2012
CN 102595301 A 7/2012
(Continued)

*Primary Examiner* — Md S Elahee
(74) *Attorney, Agent, or Firm* — Harrington & Smith

(57) ABSTRACT

A speaker including a case, a display configured to display an image, at least one vibrating element configured to actuate the display to move the display relative to the case to generate acoustic waves, a gasket interfacing the case and the display, and a transceiver located within a speaker internal volume.

18 Claims, 28 Drawing Sheets

(51) Int. Cl.
 G06F 3/041 (2006.01)
 G06F 1/16 (2006.01)
 *H04R 1/28* (2006.01)
 *H04R 17/00* (2006.01)

(56) References Cited

U.S. PATENT DOCUMENTS

| | | |
|---|---|---|
| 2006/0227981 A1 | 10/2006 | Miyata .......................... 381/124 |
| 2007/0252810 A1 | 11/2007 | Ranta et al. |
| 2007/0258604 A1 | 11/2007 | Bosnecker .................... 381/152 |
| 2008/0055277 A1 | 3/2008 | Takenaka et al. |
| 2009/0154732 A1 | 6/2009 | Wang ............................ 381/120 |
| 2010/0225600 A1 | 9/2010 | Dai et al. |
| 2011/0064260 A1 | 3/2011 | Andersen et al. |

FOREIGN PATENT DOCUMENTS

| | | |
|---|---|---|
| EP | 1827057 A2 | 8/2007 |
| WO | WO-0174114 A2 | 10/2001 |
| WO | WO-0245462 A2 | 6/2002 |
| WO | WO-2007023409 A2 | 3/2007 |
| WO | WO-2008136822 A2 | 11/2008 |
| WO | WO-2011114188 A1 | 9/2011 |
| WO | WO-2012052803 A1 | 4/2012 |
| WO | WO-2012114754 A1 | 8/2012 |
| WO | WO-2012129247 A2 | 9/2012 |

SPEAKER APPARATUS

CROSS REFERENCE TO RELATED APPLICATION

This is a continuation patent application of U.S. patent application Ser. No. 14/654,932 filed Jun. 23, 2015, which is a national stage application of PCT Application No. PCT/FI2014/050006 filed Jan. 7, 2014, which claims benefit of foreign priority to Great Britain Patent Application No. 1300229.0 filed Jan. 7, 2013, which are all hereby incorporated by reference in their entireties.

FIELD

The present invention relates to speaker apparatus. The invention further relates to, but is not limited to, speaker apparatus for use in mobile devices.

BACKGROUND

Many portable devices, for example mobile telephones, are equipped with a display such as a glass or plastic display window for providing information to the user. Furthermore such display windows are now commonly used as touch sensitive inputs. In some cases the apparatus can provide a visual feedback and audible feedback when recording a touch input. In some further devices the audible feedback is augmented, with a vibrating motor used to provide a haptic feedback so the user knows that the device has accepted the input.

Furthermore such devices typically also use electro-acoustic transducers to produce audio for earpiece and integrated hands free (IRF) operations as well as for alert tones. The moving coil dynamic speaker configuration used is typically relatively large in relation to the volume within the device and require specific signal processing considerations in order that the acoustic frequency response is acceptable. Furthermore moving coil transducers can attract contaminants such as small iron particles from within the internal volume of the device and also through ports provided to enable acoustic wave transmission from the speaker to the external environment. These contaminants can cause distortion and faults within the speakers significantly reducing the lifetime of the device.

Statement

According to an aspect, there is provided a speaker comprising: a case; a display configured to display an image; at least one vibrating element configured to actuate the display to move the display relative to the case to generate acoustic waves; a gasket interfacing the case and the display; and a transceiver located within a speaker internal volume.

The case may be a unibody case. Alternatively the case may comprise multiple parts, for example a side surface plus a battery cover.

The at least one vibrating element may comprise at least one piezo-electric transducer.

The gasket may comprise a suspension part coupled at one end to case and at another end to the display, wherein the suspension part is configured to suspend the display relative to the case by the bending force of the suspension part, such that the display assembly is configured to move relative to the case.

The suspension part may be a resilient folded surface, configured to suspend the display relative to the case by the bending force of the resilient folded surface.

The gasket may comprise a first support part configured to lock the gasket position within the speaker so as to provide a fixed suspension in the direction of movement of the display.

The gasket may comprise a second support part configured to form a frame which is coupled to the display so as to couple the display to the suspension part of the gasket.

The display may comprise a support ring configured to support the display and coupled to the gasket.

The display may comprise a display frame substantially surrounding the display and coupled to the at least one vibrating element.

The display frame may comprise at least one stop enabling the display to move in at least one axis and configured to mechanically limit the motion of the display in the at least one axis.

The speaker may further comprise at least one further internal component, wherein the at least one further component comprises: an internal chassis; at least one camera; at least one microphone; at least one data socket; at least one power socket; a printed wiring board; a printed circuit board; a SIM assembly; an input key or button; a camera flash; a battery; and a battery frame.

The speaker may further comprise at least one port wherein the speaker internal volume is ported to the exterior of the speaker by the at least one port.

The at least one port may comprise: a breathing hole; a AV jack hole; a USB hole; a power port configured to receive a power plug; and a data port configured to receive a data plug.

The speaker internal volume may be divided into chambers by at least one internal component such to provide a tuned response for the speaker.

The tuned response may be a tuned frequency response.

The at least one vibrating element may be configured to actuate the display to move the display relative to the case to generate localised tactile effects on the display.

The localised tactile effects may comprise a haptic feedback.

The transceiver may be at least one of: a radio frequency transmitter; a radio frequency receiver; a cellular engine.

The speaker internal volume may be formed based on at least internal surfaces of the case, the display and the gasket.

The display may comprise at least one of: a display component; and a display window.

The at least one vibrating element may be configured to actuate the display by at least one of: a direct coupling between the vibrating element and the display; and an indirect coupling between the vibrating element and the display.

The speaker internal volume may be based on the internal dimensions of the case, display and the gasket.

The gasket may be configured to provide a tuned performance for at least one of: an acoustic output and a haptic feedback.

The tuned performance may be based on at least one of: a shape of the gasket; a material of the gasket; and dimensions of the gasket.

The gasket may substantially surround the periphery of the display.

According to a second aspect, there is provided a speaker comprising: casing means; means for displaying an image; means for actuating the means for displaying an image relative to the casing means to generate acoustic waves; means for interfacing the casing means and means for displaying an image; and means for transmitting or receiving a radio frequency signal located within a speaker internal volume.

The casing means may be a unibody case.

The means for actuating may comprise at least one piezo-electric transducer.

The means for interfacing may comprise suspension means coupled at one end to the casing means and at another end to the means for displaying an image, wherein the suspension means are configured to suspend the means for displaying an image relative to the casing means by the bending force of the suspension means, such that the means for displaying an image is configured to move relative to the casing means.

The suspension means may be a resilient folded surface, configured to suspend the means for displaying an image relative to the casing means by the bending force of the resilient folded surface.

The means for actuating may be configured to move the means for displaying an image relative to the casing means to generate localised tactile effects on the means for displaying an image.

An electronic device may comprise a speaker as described herein.

SUMMARY OF FIGURES

For better understanding of the present invention, reference will now be made by way of example to the accompanying drawings in which.

DESCRIPTION OF EXAMPLE EMBODIMENTS

Figure 1:
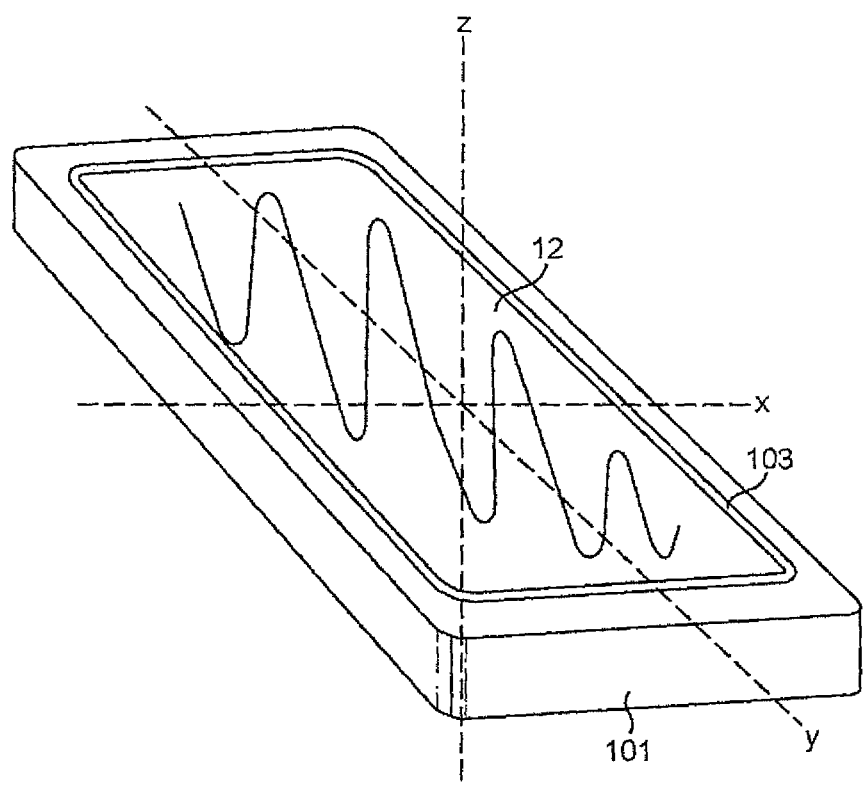
FIGS. 1 to 4 show schematically three dimensional views of example speaker apparatus according to some embodiments.

The application describes apparatus and methods of construction for speaker apparatus or module comprising a unibody or substantially unibody forms of casing, a display, a flexible gasket connecting, coupling or interfacing the unibody casing and the display, a vibration element located within an internal volume defined by the unibody, display and gasket wherein the vibration element actuates the display causing the display to move relative to the unibody, and a transceiver or receiver (for example a cellular engine) also located within the internal volume. It would be understood that in some embodiments the vibration element can operate on the display directly or a component coupled or connected to the display such that the vibration element actuates or moves the display. In other words the actuation can be a direct actuation or an indirect actuation.

It would be understood that in some embodiments as described herein the vibration element can comprise at least one piezo-electric transducer configured to move/actuate the display relative to the casing.

The actuation can be configured therefore to generate acoustic waves and/or in some embodiments tactile or haptic effects.

Furthermore the internal cavity is as described herein defined by the internal surfaces or dimensions of the unibody case, the display, the gasket between the case and display and furthermore any internal components such as the vibration element, transceiver (cellular engine, receiver etc).

In some embodiments as described herein in order to break the internal air stiffness when the display actuates by the vibration element(s) the casing can comprise an acoustic port, which in some embodiments is an outlet used for a different operation (for example an audio socket, USB socket or other port) or a specific acoustic port or outlet configured to acoustically port the internal cavity.

In some embodiments as described herein the internal cavity can be divided or sub-divided into sections. For example the air cavity 'underneath' the vibration element (and/or above the PWB) is acoustically designed wherein such cavity can be ported out and such cavity can be substantially sealed.

It would be understood that in some embodiments the speaker can comprise within the internal cavity other components/parts, for example a camera, microphone(s) as well as a printed circuit board (PCB), printed wiring board (PWB), internal support chassis.

The gasket, the unibody casing and the display are visible to the user. The unibody can in some embodiments as described herein comprise other ports or outlets for other interfaces for comonents within the speaker such as AV jack or socket port, micro USB port, microphone port.

The colour (and/or shape) of the gasket can be adjusted for visual appearance. Furthermore in some embodiments the gasket can be adjusted to tune the acoustic performance or even haptic feedback performance. The characteristics (including the dimensions and materials specifications) of the gasket thus play a role for the acoustic performance of the speaker. In further example embodiments a more flexible (softer) gasket material can provide higher sound pressure level (or an increased acoustic output) compared to harder (less flexible) suspension. It is understood that in example embodiments the gasket is an elastomer (or rubber or flexible material) wherein the material specifications is chosen for the optimum acoustic performance.

It is understood that the combination (or interconnection or interaction) of the unibody, the gasket, the display and the vibration element therefore defines or forms the speaker functionality.

With respect to FIG. 1 an orthogonal three-dimensional perspective view of an example speaker apparatus suitable for implementing embodiments of the application is shown.

The speaker apparatus can in some embodiments be also used as a mobile terminal, a mobile phone, tablet or user equipment for operation in a wireless communication system. In other embodiments, the speaker apparatus may comprise any suitable electronic device (which may be portable) configured to provide an acoustic output, such as for example a digital camera, a portable audio player (mp3 player), a portable video player (mp4 player), a television etc. The speaker apparatus, whether portable or not, may comprise cellular or non-cellular circuitry. Non-cellular devices may comprise, for example, Wi-Fi or Bluetooth connectivity.

In other embodiments the speaker apparatus can be any suitable electronic device with touch interface (which may or may not display information) such as a touch-screen or touch-pad configured to provide feedback when the touch-screen or touch-pad is touched. For example in some embodiments the touch-pad can be a touch-sensitive keypad which can in some embodiments have no markings on it and in other embodiments have physical markings or designations on the front window. The user can in such embodiments be notified of where to touch by a physical identifier—such as a raised profile, or a printed layer which can be illuminated by a light guide.

Figure 2:
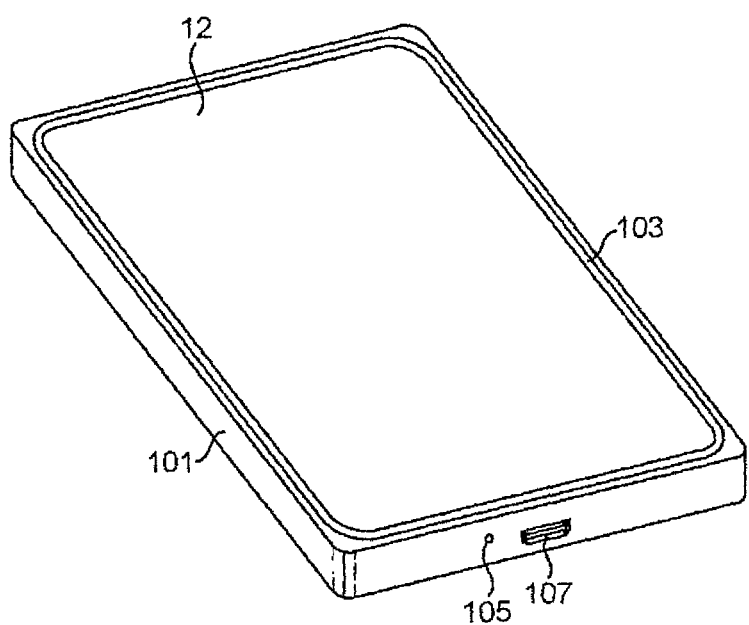

The apparatus comprises a cover or body 101 (or means for covering) which in this example is a unibody type cover, in other words formed substantially from a single piece of material which is moulded or machined into the desired form. The cover 101 as shown in FIG. 2 is of the form of a rounded elongated cuboid where the length (y-dimension) of the form is greater than the height (x-dimension) which in turn is greater than the depth (z-dimension). The vertices of the cover are shown to be rounded. The shape or form of the casing as show in FIG. 2 and otherwise are examples only and that the cover can be any suitable shape. In some embodiments a unibody like structure can be created by laser gluing, heatstaking or suitably merging by other techniques at least two parts of a casing such that the casing appears to be a single part.

The cover 101 shown in FIG. 1 has a single hole in the front face of the cover 101 suitable for receiving the display assembly and the gasket or suspension. The gasket thus in some embodiments provides a functionality of suspension which may be considered to be similar to a surround structure of a conventional loudspeaker mechanism. The hole shown in FIG. 2 is rectangular with rounded corners, however the shape of the hole can be any suitable shape for receiving the display assembly and suspension.

The cover 101 can be constructed from any suitable material and can be further permitted to have further ports or holes in other faces for enabling additional input and outputs such as for example ports or buttons. For example with respect to FIG. 2 an example speaker apparatus is shown wherein the unibody case 101 or cover further comprises a microphone hole 105 or port configured to enable acoustic wave transmission into the speaker apparatus to a microphone (not shown) located within the speaker internal volume. Furthermore as shown in FIG. 2 the example speaker apparatus is shown with the unibody case 101 comprising a USB (or derivative mini-USB, micro-USB etc) opening or port 107 enabling a USB plug to be inserted to an internally located USB socket or vice versa.

Figure 3:
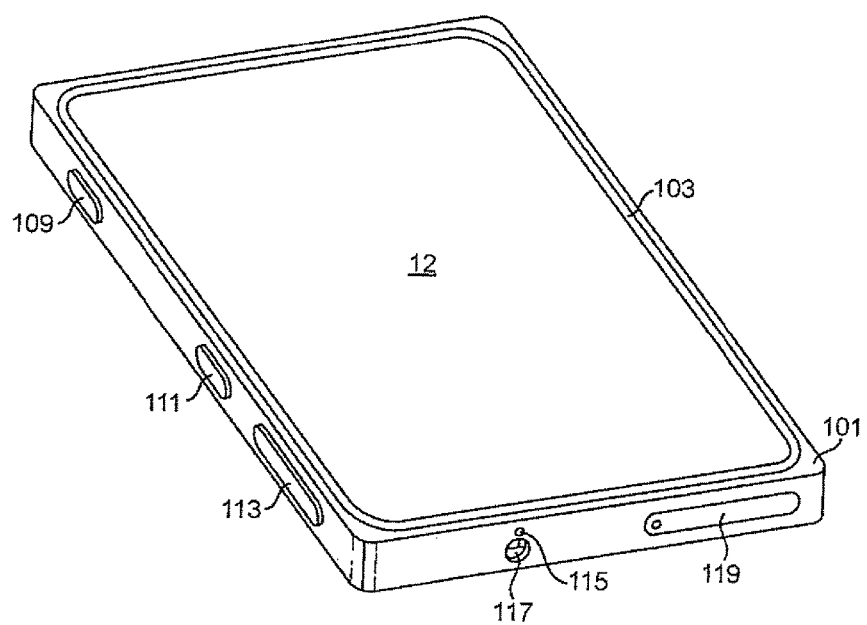

Furthermore with respect to FIG. 3 the example speaker apparatus is shown from the opposite side compared to FIG. 2 wherein the unibody case 101 or cover further comprises along the long side shown a camera key port 109 (for allowing a camera operation key to pass through and operate), a power key port 111 (for allowing a power on/off and other operational mode switching operation inputs), a volume key port 113 (for allowing a volume operation key to pass through and operate). Furthermore along the short side there is shown a breathing hole or port 115 configured to enable the acoustic cavity to breathe and thus to prevent undue dampening of the display movement as described herein, a AV jack hole or port 117 configured to enable the user to insert a suitable AV plug into a AV socket (not shown) located within the apparatus, and a SIM door or port 119 to enable a SIM module to be inserted into the apparatus and interface with the apparatus.

Figure 4:
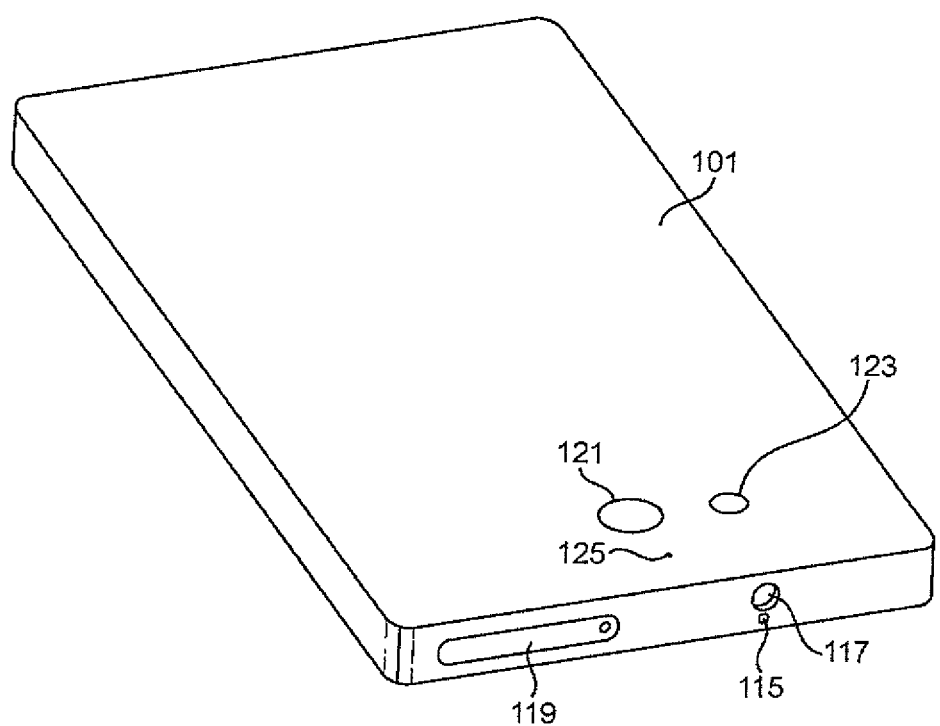

Furthermore with respect to FIG. 4 the example speaker apparatus is shown from the rear of the apparatus when compared to FIG. 3 and as such the display and gasket are not visible. However as shown in FIG. 4 the unibody case 101 or cover further comprises along the short side the breathing hole or port 115, AV jack hole or port 117, and SIM door or port 119 shown in FIG. 3 and also on the rear face is shown a main camera port 121 within which can be located the lens or cover for the camera module located within the apparatus, a flash lens port 123 within which can be located the flash lens, and a second microphone hole or port 125 which is configured to enable acoustic wave transmission into the speaker apparatus to a second microphone (not shown) located within the speaker internal volume.

Unibody construction is particularly useful in constructing good quality apparatus as the cover can have fewer holes and leaks and therefore a lower probability of dust or foreign particle penetration. Furthermore, unibody cover or case acoustical properties are generally easier to tune. Furthermore a unibody construction is also easier for product assembly and manufacturing as the complexity is reduced.

The apparatus as shown in FIGS. 1 to 3 further can comprise a display assembly 12 (or display means or display stack). The display assembly 12 as described herein can be any suitable display technology. The display assembly can in some embodiments comprise a display and cover window or in some embodiments the cover window only operating over a static display component.

The display 12 may comprise any suitable display technology. For example the display element can be located below the touch input module and project an image through the touch input module to be viewed by the user. The display 12 can employ any suitable display technology such as liquid crystal display (LCD), light emitting diodes (LED), organic light emitting diodes (OLED), flexible OLED (FOLED) plasma display cells, Field emission display (FED), surface-conduction electron-emitter displays (SED), and Electophoretic displays (also known as electronic paper, e-paper or electronic ink displays). In some embodiments the display 12 employs one of the display technologies projected using a light guide to the display window. In some embodiments the display is a 2-D display. In other embodiments the display may be a 2.25-D, 2.5-D or 3-D display (discussed in more detail below with respect to FIG. 26).

In some embodiments, the display assembly 12 comprises a touch input module or means for receiving or determining a touch input. In some embodiments such as described herein the touch input module and display 12 are parts of the same component and can be referred to as the display part or touch display part.

The touch input module can in some embodiments implement any suitable touch screen interface technology. For example in some embodiments the touch screen interface can comprise a capacitive sensor configured to be sensitive to the presence of a finger above or on the touch screen interface. The capacitive sensor can comprise an insulator (for example glass or plastic), coated with a transparent conductor (for example indium tin oxide—ITO). As the human body is also a conductor, touching the surface of the screen results in a distortion of the local electrostatic field, measurable as a change in capacitance. Any suitable technology may be used to determine the location of the touch. The location can be passed to the processor which may calculate how the user's touch relates to the device. The insulator protects the conductive layer from dirt, dust or residue from the finger.

In some other embodiments the touch input module can be a resistive sensor comprising of several layers of which two are thin, metallic, electrically conductive layers separated by a narrow gap. When an object, such as a finger, presses down on a point on the panel's outer surface the two metallic layers become connected at that point: The panel then behaves as a pair of voltage dividers with connected outputs. This physical change therefore causes a change in the electrical current which is registered as a touch event and sent to the processor for processing.

In some other embodiments the touch input module can further determine a touch using technologies such as visual detection for example a camera either located below the surface or over the surface detecting the position of the finger or touching object, projected capacitance detection, infra-red detection, surface acoustic wave detection, dispersive signal technology, and acoustic pulse recognition. In some embodiments it would be understood that 'touch' can be defined by both physical contact and 'hover touch' where there is no physical contact with the sensor but the object located in close proximity with the sensor has an effect on the sensor.

Furthermore the apparatus comprises a gasket 103, or suspension component. The gasket 103 is in some embodiments a flexible material permitting the movement of the display relative to the case. This may be movement of the display module itself and/or movement of a display window. In the embodiments described herein the suspension component is configured to suspend the display 12 relative to the cover or casing 101. Although it would be understood that the cover or casing 101 can in some embodiments be considered to be part of the apparatus 'body' from which the display and/or display window is suspended. The suspension component can in some embodiments be a bellows or pleated material suspension. The bellows suspension 103 is shown in FIG. 1 surrounding the periphery of the display assembly 12. It would be understood that in some embodiments the unibody like structure can comprise a side band and a back cover, wherein the combination of side band and the back cover can perform in a manner similar to a single unibody.

A 'floating' display gasket or suspension proposal is where a flexible membrane is located at least partially around the periphery of the display assembly and partially around (typically underneath) the cover or casing edge. The elasticity of the membrane as it stretches (and relaxes) forms a flexible interface between the display assembly and the cover.

The gasket 103 (which can be a bellows or any other type of suspension gasket) as described herein can be configured such that the fabrication of the apparatus within which the display assembly is to be fixed can be easily achieved even within a unibody type cover (a cover which substantially is a single piece of material rather than being formed from various sub-cover assemblies). A gasket further assists the forming of a well sealed construction between the front window (or glass) and the cover (body or casing) of the apparatus. The gasket thus can be considered to control the movement of the display when the vibration element is driven. In other words the gasket provides a controlled movement to the display.

A further advantage of the gasket arrangement as described herein is that it permits a narrower display dead band (the area surrounding the display which is not capable of displaying images). This permits speaker designs where the display area is to be close to the maximum surface face area, in other words the display is close to the apparatus edge.

Figure 5:
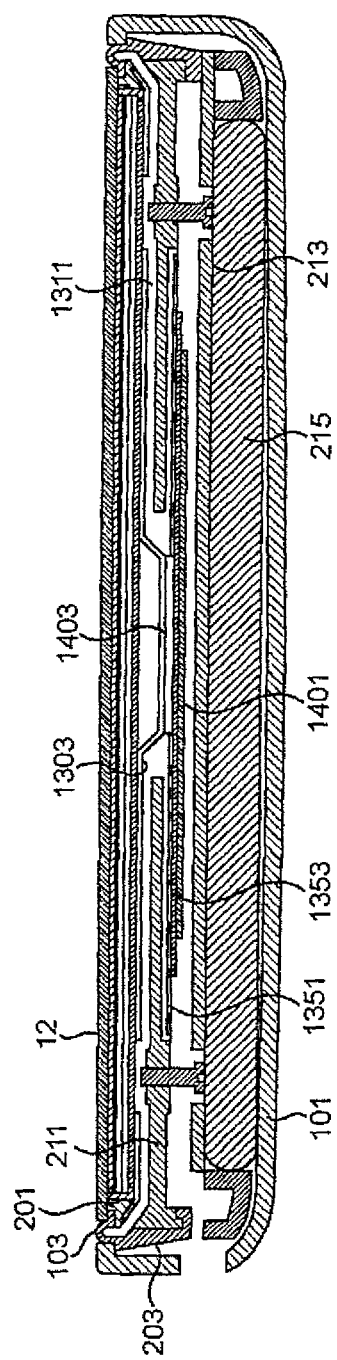
FIGS. 5 to 8 show schematically cross sectional views of example speaker apparatus according to some embodiments.

With respect to FIG. 5 is shown a detailed cross-sectional view of the apparatus according to some embodiments. Furthermore with respect to FIG. 6 a detail of the FIG. 5 with respect to the case 101, gasket 103 and display interface is shown. The cross sectional view shows the unibody case or cover 101 having a lower or rear rounded corner with a larger radius of curvature and an upper or front rounded corner with a sharper or smaller radius of curvature. The unibody case or cover 101 front rounded corner then defines an upper or front lip region. The upper or front lip region can be seen as being the material which defines the unibody hole. In some embodiments the material used for the flexible bellow may be thermoplastic elastomer (TPE), however it will be understood that any other suitable material may be used. The flexible bellow may have a hardness in the region of shore A 60. In some embodiments the more flexible the bellow is, the better the performance. The material selected for the bellow may differ between embodiments, and is suitably selected based on the acoustic performance. The material selected may also be based upon other surrounding or interfacing components, such as the display, chassis, case, and/or internal volume of the apparatus. In alternative embodiments the material may also be selected based upon visual appearance. The flexible material may be coated, that is the flexible material may comprise a further outer layer.

It would be understood that the apparatus can comprise internal components which can be located within an internal volume substantially defined by interior edges of the unibody case or cover 101, the display assembly 12 and the gasket 103. These are shown in the examples and are discussed briefly.

The internal components within the cover 101, the display assembly 12 and the gasket 103 can for example comprise components such as a battery 215, a printed wiring board 213 (or in some embodiments a printed circuit board) with components located on at least one of the sides of the printed wiring board.

The printed wiring board 213 and battery 215 can furthermore be configured to be located within the cover by an internal chassis 211. The internal chassis 211, which in some embodiments is constructed from metal such as aluminium, can generate a rigid structure which locates the internal components of the apparatus and prevents the casing or cover 101 from flexing significantly. In some embodiments the cover 101 comprises mouldings or structures which can be configured to operate as the chassis 211. In other words the unibody casing or cover 101 can be configured with mouldings or structures which divide or sub-divide the internal volume of the apparatus.

In some embodiments the cover 101 and the internal chassis 211 can be designed to locate at least a first support part (or shot) of the gasket operating as a suspension part.

The gasket 103 can thus in some embodiments comprise a first support located between the outside of the chassis member 211 and the inside of the unibody cover 101. In such embodiments the first support part 203 cart be shaped such that it has a lip or tab which fits or matches the profile of the cover lip section such that when the suspension is inserted into the unibody hole the suspension is fixed vertically and thus cannot move freely in the up-down (z-dimension) direction, where the chassis and cover fix the suspension horizontally and thus prevent the first support part 203 from moving in the side-to-side directions (x and y-dimensions).

The gasket 103 can further comprise a flexible folded surface part. The flexible folded surface part is configured to couple at one end the first support part 203 and couple at the other end the second support part 201 and be able to suspend the display by the bending forces within the flexible folding surface.

Figure 6:
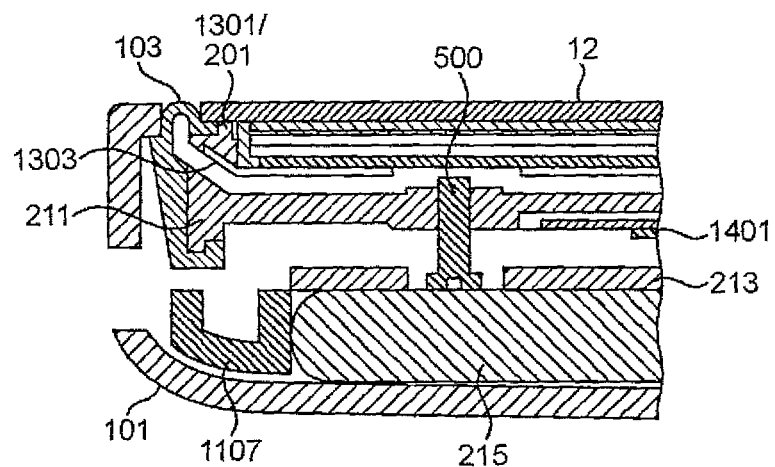

The gasket suspension as shown in FIGS. 5 and 6 is located at one end to the first support part 203 thus locating one end of the folded surface part relative to the cover/chassis. In other words a first arm of the gasket is located relative to the static components of the apparatus.

The flexible folded surface part (bellows section) comprises at least one fold or pleat. In the example shown in FIGS. 5 and 6 the folded surface part comprises a first approximately 180 degree curved fold forming an n-fold (inverted u-fold) and a second 90 degree fold converting the vertical surface to a horizontal surface.

It would be understood that the number, direction and angle of the folds within the folded surface region can differ from embodiment to embodiment.

The gasket further comprises a second support part 201 which is configured to be coupled to the flexible surface part and to the display assembly (in other words the dynamic or moving portion of the suspension). The second support part 201 in some embodiments is formed from plastic and in some embodiments the same type of material as the first support part 203.

The second support part 201 in other words can in some embodiments form a frame which is coupled to the display assembly. For example as shown in FIGS. 5 and 6 the second support part 201 forms a frame over which the display stack is located.

The second support part as shown in FIGS. 5 and 6 further shows the second support part 201 as part of a display frame 1301 and sheet display support 1303. Furthermore in some embodiments the use of the sheet display support 1303 prevents the display from separating from the apparatus cover completely.

In the examples shown in FIGS. 5 and 6 the display is supported and coupled to the suspension by the second support part 201 as part of a display frame 1301 within which the display assembly is located. For example as shown in FIGS. 5 and 6 the display frame or second support part is an insert moulded plastic which can be glued along a top surface to the front window of the display 12, glued to an outer surface to the bellows gasket part 103 and glued to an under surface to a sheet or support sheet. In such embodiments the sheet or support sheet 1303 is a shaped (for example stamped or bent sheet of metal) sheet underneath the display and touch stack. In other words the display assembly can be in some embodiments protected from underneath (or supported from underneath) by the support sheet 1303.

In some embodiments the gasket can be also designed as a single part. Thus in such embodiments the gasket single part is suitably shaped and designed to locate the display relative to the casing and provide the suspension and therefore control of the motion of the display relative to the casing.

In the example shown in FIGS. 5 and 6 the gasket 103 comprises a shaped or bent profiled soft material such as urethane or silicone. The gasket 103 can in some embodiments, and as described herein, be formed with a variable profile. For example the bent or suspension part coupling the display side and body side parts of the suspension can be configured to have a substantially consistent profile or thickness providing when bent an expected degree of flexibility and resilience. Furthermore the body side part of the suspension can be configured with a variable profile or thickness configured to enable the gasket to locate and fix the suspension underneath the cover 101 and particularly underneath the cover lip. Furthermore in some embodiments the body side part of the gasket can be configured with a profile lip configured to fit between the chassis 211 and the printed wiring board 213 and lock the suspension to the chassis 211.

In some embodiments the chassis 211, which in the embodiments shown in FIGS. 5 and 6 is an aluminium chassis 211, can be configured with a co-operating lip profiled to lock the gasket between the chassis and the printed wiring board 213.

Furthermore, as shown in FIGS. 5 and 6, the chassis can be profiled to create an air gap 1311 between the rear of the sheet metal 1303 underneath the display and the chassis 211 enabling the display to move within a defined region. The presence of the air gap between the moving display and the chassis 211 may prevent rattling and/or other undesirable noise.

As shown in FIGS. 5 and 6 the printed wiring board 213 furthermore can be located relative to the cover 101 by the chassis 211 and a battery frame 1107 which further locates a battery 215.

With respect to FIGS. 5 and 6 the apparatus comprises a vibrating means such as a piezo component 1401 (which may be a piezo actuator) coupled to the chassis 211 at either end of the piezo component 1401 and coupled at the central region of the piezo component 1401 to a transfer part 1403 configured to transfer the force of the bending of the piezo component to the display (and/or display window). In the example shown in FIGS. 5 and 6 the transfer part 1403 is coupled to a 'cup-shape' section of the sheet metal 1303 behind the display such that the user component transfers force via the transfer part 1403 to the display via the sheet metal 1303.

Furthermore in some embodiments the chassis 211 comprises a locking part (not shown) which has a defined profile configured to lock to a cooperating gasket part. In some embodiments the gasket can be located on one side between the printed wiring board and the chassis 211 and located on the other side by the cooperating profile parts or locking parts of the chassis locking part and the gasket locking part.

With respect to FIGS. 5 and 6 is further shown the piezo transducer or actuator 1401 located to the chassis via a FPC (flexible printed circuit) or FR4 layer 1353 for electrical connection and a metal shim plate 1351 for mechanical connection. Furthermore the piezo transducer 1401 is lifted from the PWB and battery by at least one piezo fixing screw 500, which in some embodiments is adjustable.

The piezo actuator 1401 can be driven with a mono signal, or in an alternative embodiment two or more actuators can be driven with two or more signals, for example a stereo signal.

In some embodiments a dynamic lock is implemented producing a mechanical stop of the display. In some embodiments the sheet metal or sheet 1303 is configured with a stamped and bent part which forms a display stop. The display stop can be shaped such that the chassis 211 passes through the hole between the sheet and display stop so that the motion of the display is limited by the display, stop in an upper direction by the chassis stop and in a lower direction by the printed wiring board.

The display assembly 12 in some embodiments comprises a window (or display window or glass) which can be a glass or other suitable toughened layer for physically protecting the display 207. The display assembly can further in some embodiments comprise a display 207. The suspension of the window and display 207 by the folded surface part 103 of the gasket is such that at rest (in other words with no additional force applied) there is an air gap between the window assembly and the static portion of the apparatus such as shown by the chassis 211.

Figure 7:
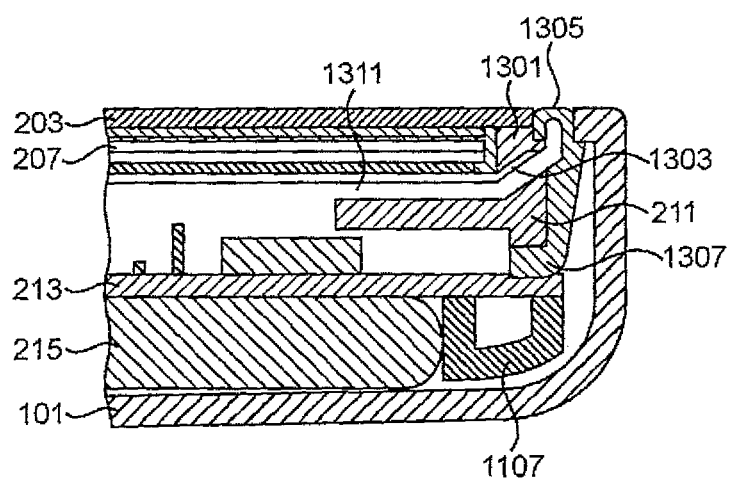
Figure 8:
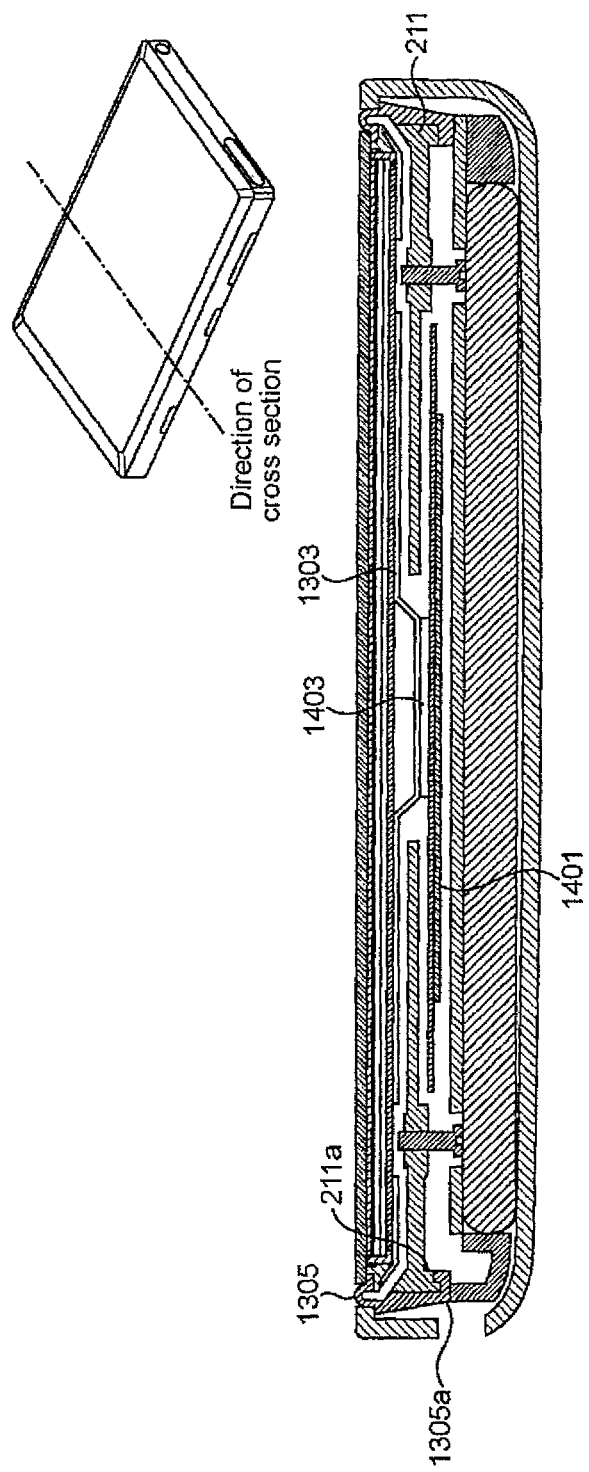
Figure 15:
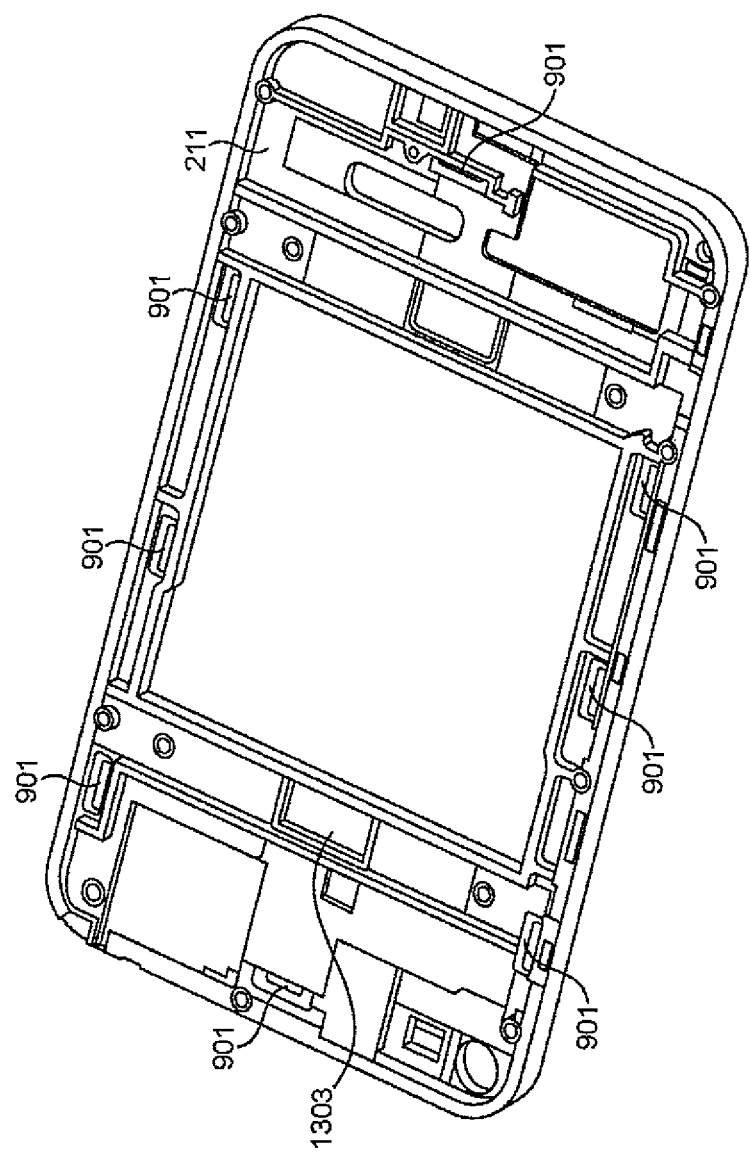
FIGS. 15 and 16 show schematically details of the example display frame for the speaker assembly example according to some embodiments.

With respect to FIGS. 7 and 8 a further example of the gasket in operation is shown. In the example shown in FIG. 7 the display is supported and coupled to the suspension by a display frame 1301 within which the display assembly is located. For example as shown in FIG. 15 the display frame is an insert moulded plastic which can be glued along a top surface to the front window 203, glued to an outer surface to the gasket 1305 and glued to an under surface to a sheet or support sheet. In such embodiments the sheet or support sheet 1303 is a shaped (for example stamped or bent sheet of metal) sheet underneath the display and touch stack 207. In other words the display assembly can be in some embodiments protected from underneath (or supported from underneath) by the support sheet 1303.

In the example shown in FIG. 7 the gasket 1305 or bellows suspension comprises a shaped or bent profiled soft material such as urethane or silicone. The gasket 1305 can in some embodiments, and as described herein, be formed with a variable profile. For example the bent or suspension part coupling the display side and body side parts of the suspension can be configured to have a substantially consistent profile or thickness providing when bent an expected degree of flexibility and resilience. Furthermore the body side part of the suspension can be configured with a variable profile or thickness configured to enable the bellows suspension to locate and fix the suspension underneath the cover 101 and particularly underneath the cover lip. Furthermore in some embodiments the body side part of the suspension can be configured with a profile lip 1307 configured to fit between the chassis 211 and the printed wiring board 213 and lock the suspension to the chassis 211.

In some embodiments the chassis 211, which in the embodiments shown in FIG. 7 is an aluminium chassis 211, can be configured with a co-operating lip profiled to lock the bellows suspension lip 1307 between the chassis and the printed wiring board 213.

Furthermore, as shown in FIG. 7, the chassis can be profiled to create an air gap 1311 between the rear of the sheet metal 1303 underneath the display and the chassis 211 enabling the display to move within a defined region.

In some embodiments there can be an acoustic cavity located underneath of the display, which can be a controlled acoustic cavity. Such an acoustic cavity is substantially sealed and within the acoustic cavity is located other parts or electronic components associated with the operations of the electronic device/apparatus. In some embodiments sealed cavity can be ported out to break stiffness or other acoustic arrangements (in a manner similar to a bass reflex port).

As shown in FIG. 7 the printed wiring board 213 furthermore can be located relative to the cover 101 by the chassis 211 and a battery frame 1107 which further locates the battery 215.

With respect to FIG. 8 a further view of the gasket configuration as shown in FIG. 7 is shown. In the example shown in FIG. 8 the cross-sectional view shows the location of the piezo component 1401 coupled to the chassis 211 at either end of the piezo component 1401 and coupled at the central region of the piezo component 1401 to a transfer part 1403 configured to transfer the force of the bending of the piezo component to the display. In the example shown in FIG. 8 the transfer part 1403 is coupled to a 'cup-shape' section of the sheet metal 1303 behind the display such that the user component transfers force via the transfer part 1403 to the display via the sheet metal 1303.

Furthermore as shown in FIG. 8 in some embodiments the chassis 211 comprises a locking part 211a which has a defined profile configured to lock to a cooperating bellows locking part 1305a of the bellows suspension 1305. In some embodiments the bellows suspension can be located on one side between the printed wiring board and the chassis 211 and located on the other side by the cooperating profile parts or locking parts of the chassis locking part 211a and the bellows locking part 1305a.

Figure 9:
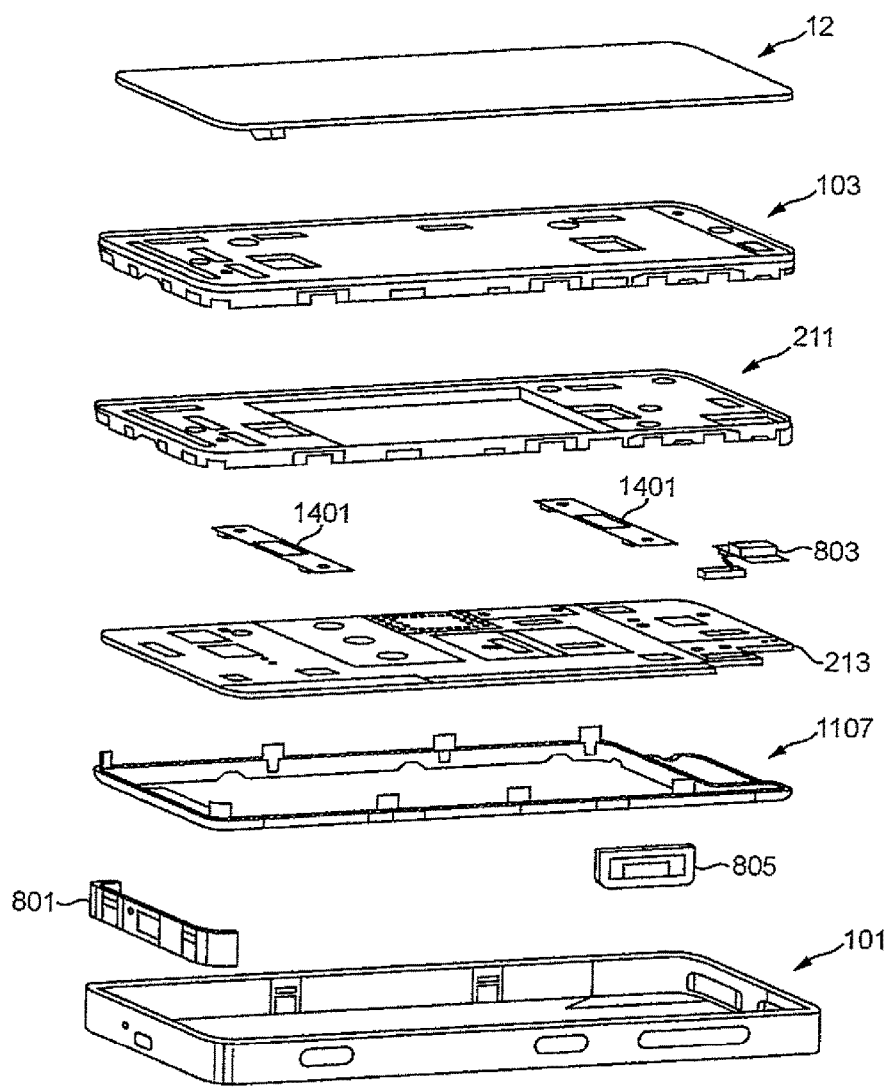
FIG. 9 shows an exploded view of an example speaker assembly according to some embodiments.

With respect to FIG. 9 is shown an exploded view of an example of the apparatus comprising the display assembly 12 or module 12, the display frame with gasket 103, the chassis 211, the piezo assemblies 1401, a front camera 803 configured to be glued to the display frame, the engine PWB 213, the battery frame 1107, cellular antennas 801, WLAN, GPS and BT antenna 805, and unibody assembly 101.

Figure 10:
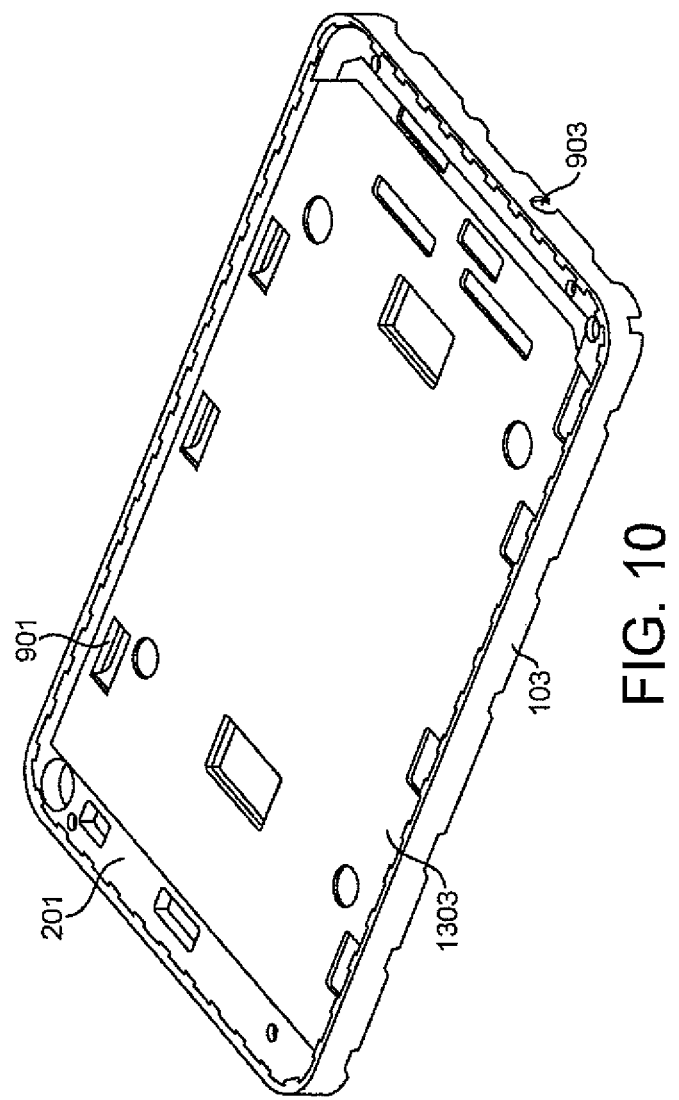
FIG. 10 shows schematically a three dimensional view of an example display frame for an example speaker assembly according to some embodiments.
Figure 11:
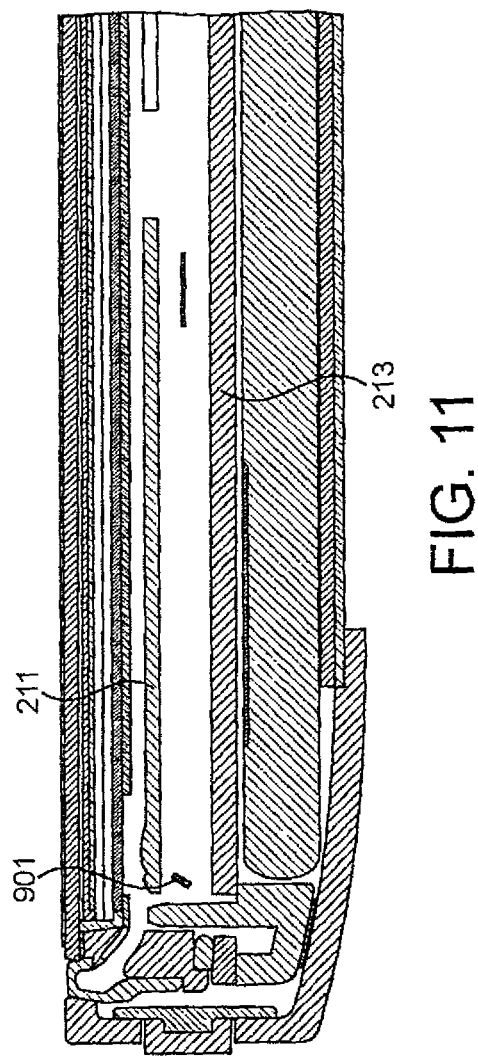
FIGS. 11 and 12 show schematically cross sectional details of the example display frame for the speaker assembly example according to some embodiments.
Figure 12:
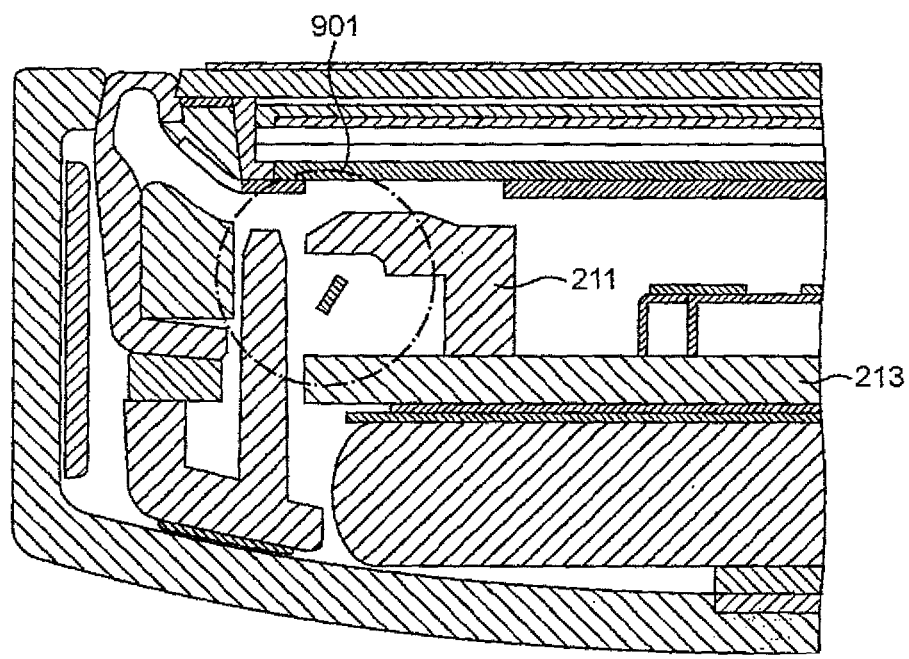
Figure 16:
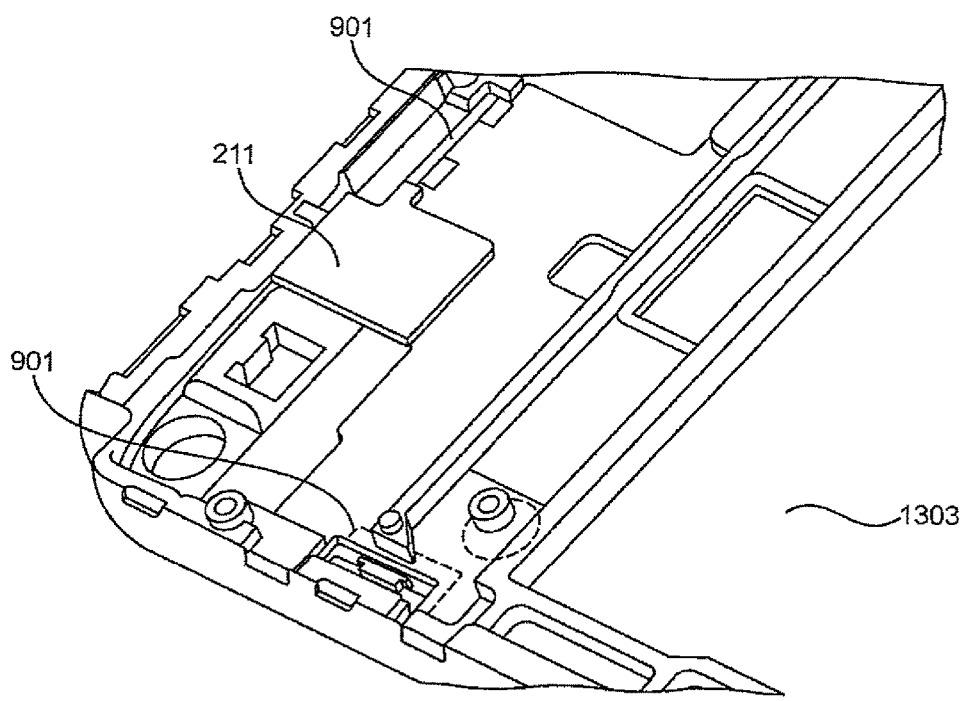

With respect to FIG. 10 is shown an isometric view of the display frame with gasket as shown in FIG. 9. The display frame with gasket as shown in FIG. 10 comprises the display frame sheet metal 1303 which is surrounded by the hard plastic gasket part 201. In the example shown in FIG. 10 the display sheet metal 1303 comprises the display stop shown by the hooks bended downwards 901. As described herein the display stop in the form of the hooks 901 can be shaped such that the chassis 211 passes through the hole between the sheet and display stop so that the motion of the display is limited by the display stop in an upper direction by the chassis stop and in a lower direction by the printed wiring board. This can be seen for example with respect to FIGS. 11 and 12 where the display hooks 901 in the display frame sheet metal 1303 can be seen to limit the motion of the display frame sheet metal 1303 with respect to the upper direction by the chassis stop 211 and in a lower direction by the printed wiring board 213. Furthermore with respect to FIGS. 15 and 16 the underside of the chassis 211 is shown showing the hooks 901 over the chassis stops. The display hooks 901 may, for example, prevent the display from falling out of the device in case of a heavy impact, such as when the device is dropped on the floor.

The hard plastic gasket part 201 is itself surrounded by the soft bellow gasket 103 which in some embodiments comprises TPE with a shore A score of 60. In some embodiments the soft bellow gasket 103 part is located to the internal hard plastic gasket part 201 by the use of interlocking features 903, however, as discussed herein any suitable fixing, such as glue can be used in some embodiments.

Figure 13:
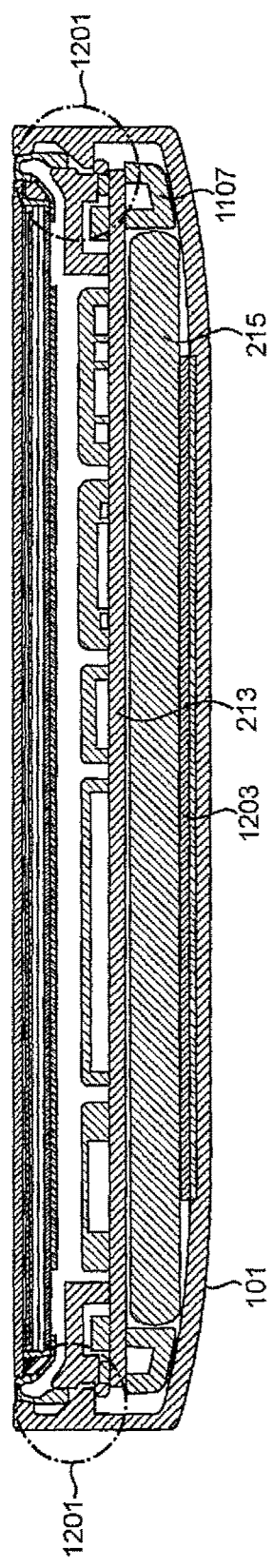
FIGS. 13 and 14 show schematically snap fit features for the speaker assembly example according to some embodiments.
Figure 14:
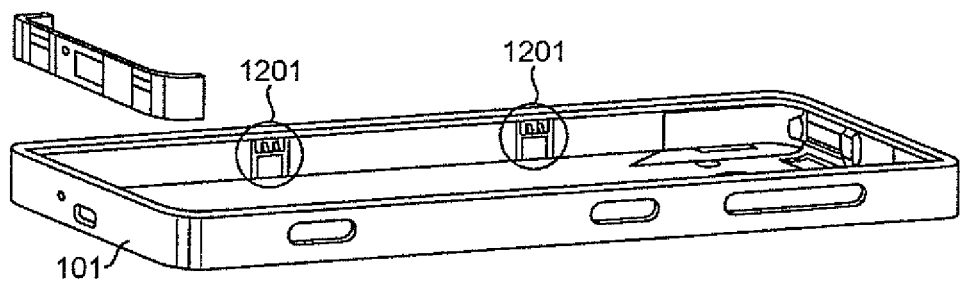

With respect to FIGS. 13 to 14 is further shown embodiments of the example apparatus with respect to the location of the display frame sheet metal and the gasket 103 with respect to the chassis and the case.

With respect to FIG. 13 the display and gasket are shown with a snap fit 1201 configuration which locates the gasket and frame with respect to the chassis. The chassis is then located with respect to the unibody case by the implementation of tabs.

Furthermore as shown in FIG. 13 the chassis is located with respect to the engine PWB 213. The PWB 213 can be which is then located within the unibody casing 101 by the battery frame 1107 which is shown glued to the interior of the unibody 101. Furthermore in some embodiments the battery is located to the inside of the unibody 101 by using a battery foam gasket 1203 to compensate for battery swelling, or rattling.

With respect to FIG. 14 the unibody snap fit elements are shown wherein the unibody is configured with a series of guiding ramps 1201 against which the snap fit elements of the gasket and chassis are located. The tabs or profile of the chassis, when the chassis is pushed into the unibody case 101 run against the guiding ramps until the chassis locks into position.

With respect to FIGS. 17 to 20 are shown a series of cross sectional views through the example apparatus.

Figure 17:
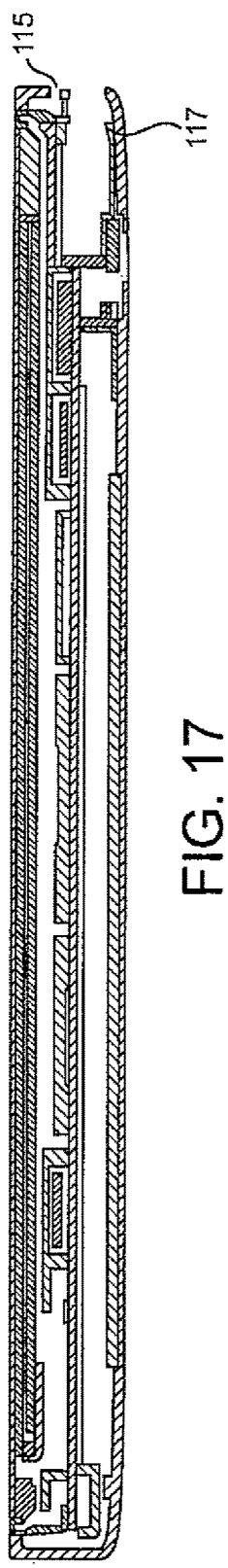
FIGS. 17 to 20 show schematically cross sectional details of the example speaker according to some embodiments.

With respect to FIG. 17 an example cross sectional view of the example apparatus is shown where the cross section is through the AV jack hole 117 or port and breathing hole 115 or port. In the example shown herein the apparatus is configured to use the breathing hole or port to enable air to enter and exit the internal volume substantially defined by the unibody, display, gasket and internally by the internal components of the apparatus. The breathing hole thus prevents a pressure build up or partial vacuum to form as the display moves and changes the internal volume of the apparatus, or in other words attempts to maintain a relatively constant air pressure within the volume despite the change in volume caused by the motion of the display relative to the case. The breathing hole 115 thus enables a better frequency response for the lower frequencies. The breathing hole may provide a Helmholtz resonance effect. The breathing hole 115 may provide improved frequency response at lower frequencies. In some embodiments the other ports can also be configured to operate as breathing holes. For example as shown herein the AV jack hole 117 can also be used.

Figure 18:
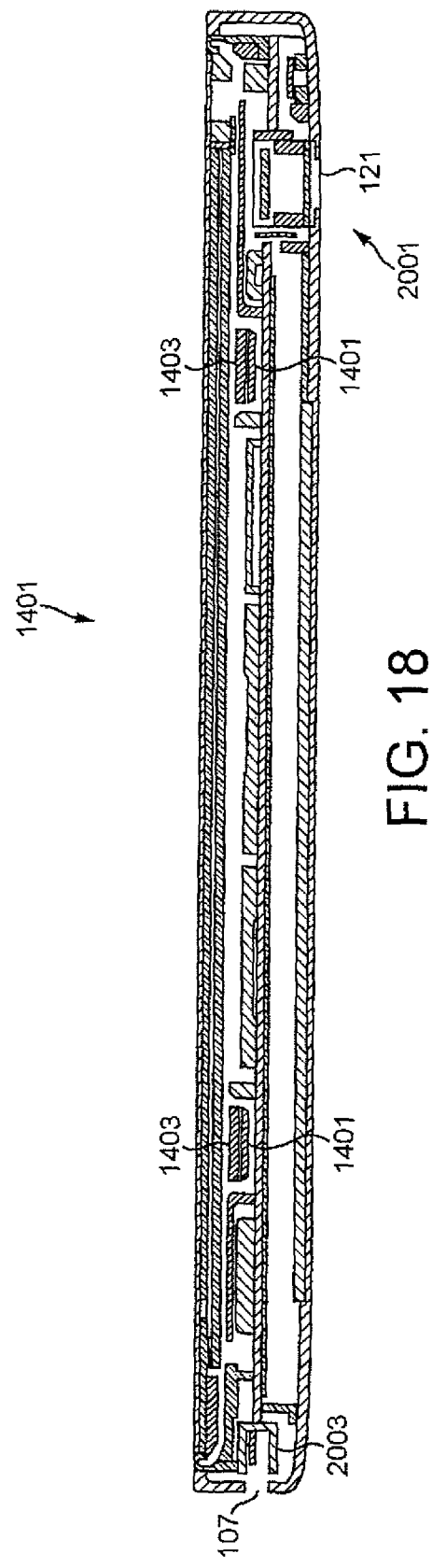

With respect to FIG. 18 an example cross sectional view of the example apparatus is shown where the cross section is through the centre of the Y axis. In this figure can be seen the piezo actuators 1401 with a foam 1403 gasket coupled to the display frame and configured to provide a force to the frame to actuate the display relative to the case 101.

Furthermore with respect to FIG. 18 is shown the apparatus USB opening 107 and the USB connector 2003. The USB opening can in some embodiments be further configured to enable the apparatus to 'breathe'. Furthermore FIG. 18 shows the apparatus main camera opening 121 and the main camera assembly 2001.

The breathing hole diameter and/or size and/or the length of the breathing hole may be used to tune or modify the frequency response of the speaker. Also the location of the breathing hole may have an influence on the frequency response curve of the panel speaker, in accordance with the Helmholtz resonance effect. In some cases the air under the display in combination with the speaker design is such that the movement of the panel speaker is damped, and/or at some frequency the breathing hole can be designed so as to create a resonance of the air flowing in and out of the device. It will of course be appreciated that any number of breathing holes may be provided.

In some embodiments a membrane or other type of barrier can be added into the flow channel of the breathing hole. This may protect the device from dust and moisture ingress. For example the membrane may be a Goretex® membrane or any other type of acoustical mesh.

Figure 19:
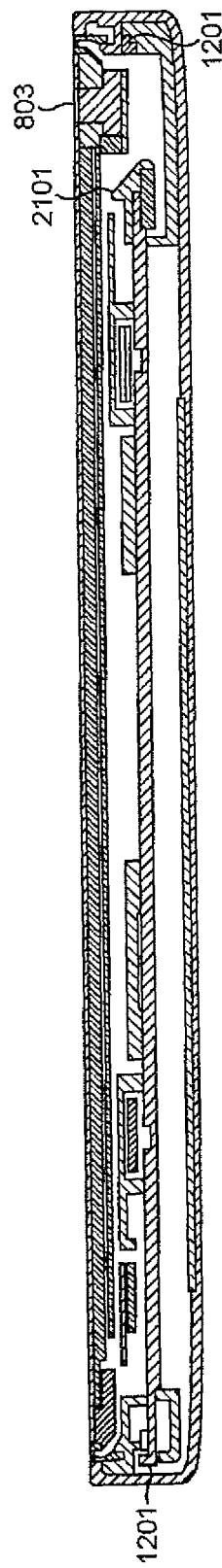

With respect to FIG. 19 an example cross sectional view of the example apparatus is shown where the cross section is through a snap fit feature. In this figure can be seen the snap fit features 1201, the front camera 803 glued to the moving display and an electrical connection to the front camera (FRC front camera 2101).

In further embodiments an ambient light sensor (ALS) and/or proximity sensor may also be mounted on to the moving display. The FPC that connects the front camera may also connect the ALS and proximity sensor with the PWB.

Figure 20:
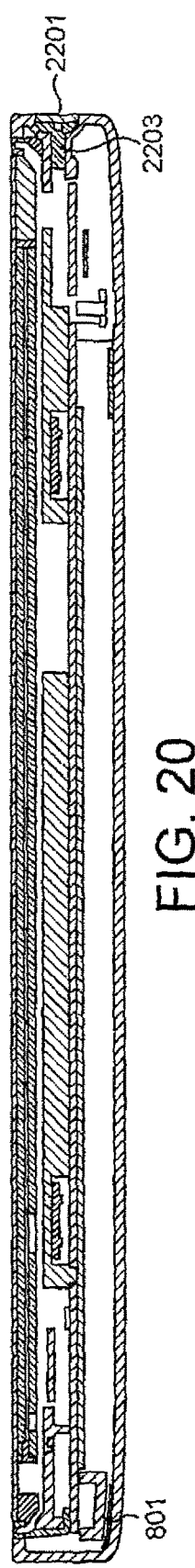

With respect to FIG. 20 an example cross sectional view of the example apparatus is shown where the cross section is through the SIM assembly showing the fixing screw. In this figure can be seen the cellular antenna radiator glued to the unibody, and at the opposite end of the apparatus is the SIM assembly with SIM door 2201.

In the example shown in FIG. 20 the internal components comprising the gasket, display, transducers, apparatus chassis and battery are inserted into the body or unibody such that the internal components as an apparatus engine are pushed towards an end of the cover. The end of the cover can, as shown, contain the antenna. The force applied compresses or squeezes the folded surface narrowing itself sufficiently that the top end can be inserted under the lip of the top end of the unibody cover.

The display assembly can in such embodiments be then inserted into the unibody hole by tilting the apparatus engine such that the suspension first support part clips under the cover. The insertion of the apparatus engine into the cover hole then releases the force compressing the newly inserted end suspension causing the first inserted end suspension to relax and regain the suspension 'resting' dimension.

Furthermore in some embodiments the 'newly or second inserted end' of the apparatus engine module can be configured to receive a screw to pull the apparatus engine module into a centralized position enabling the floating display effect to be realised. The fixing screw 2203 is shown hidden by the SIM door 2201 in some embodiments.

Although as shown the engine module or display assembly can be located with respect to a fixing member such as a screw co-operating with a hole in the suspension it would be understood that in some embodiments the display can be located by use of any suitable locating means, for example a flange or clip which can be configured to co-operated with the apparatus body.

It would be understood that in the examples discussed herein that a coupling or items coupled can be understood to be connected, attached, or fixed.

Figure 21:
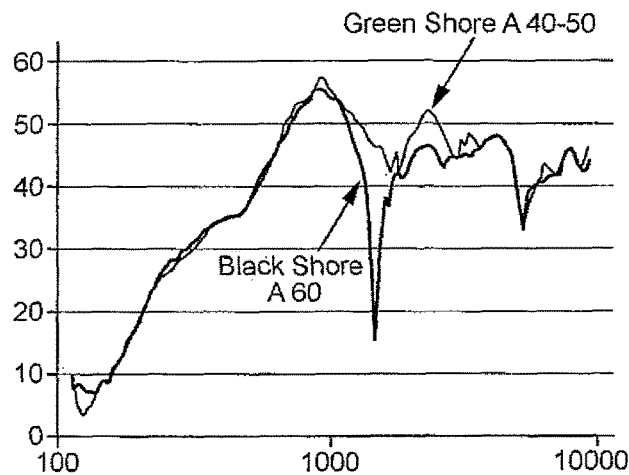
FIGS. 21 and 22 show graphical measurements of the performance of the example speaker according to some embodiments.
Figure 22:
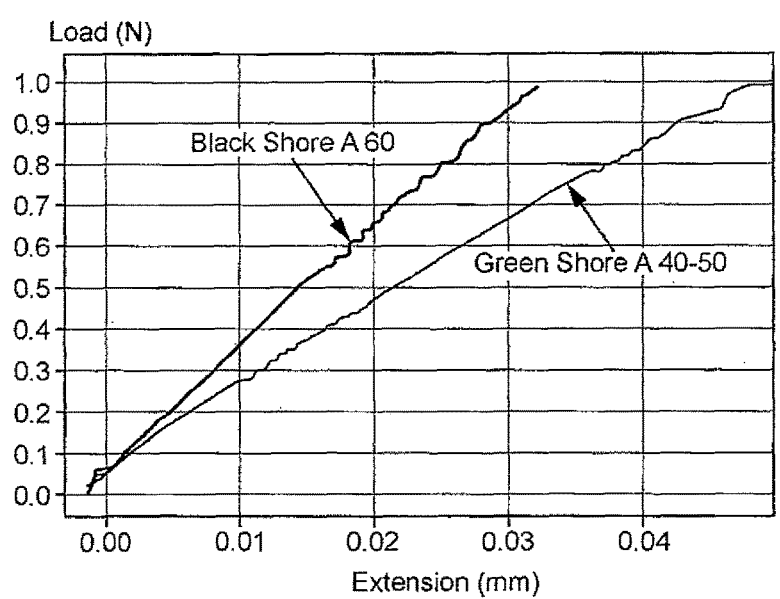

With respect to FIGS. 21 and 22 are shown graphs showing the amplitude response and load verses extension graphs of various Shore A materials for the gasket. In the examples shown a gasket ("green") with Shore A value between 40 to 50 produces more output and has a flatter frequency response between 1000 Hz to 5000 Hz when compared to a gasket ("black") with a Shore A value of 60. Furthermore the haptic response is better.

This is shown with respect to FIG. 22 where the slope of the measured response was determined for each curve, each curve relating to a different Shore rating. Thus it will be appreciated that more output and a flatter response may be achieved with a softer bellow/gasket. A stiffer bellow could result in reduced performance. A relatively stiff bellow/gasket may be a result of the material thickness being outside the required specification due to poor moulding, for example.

Figure 23:
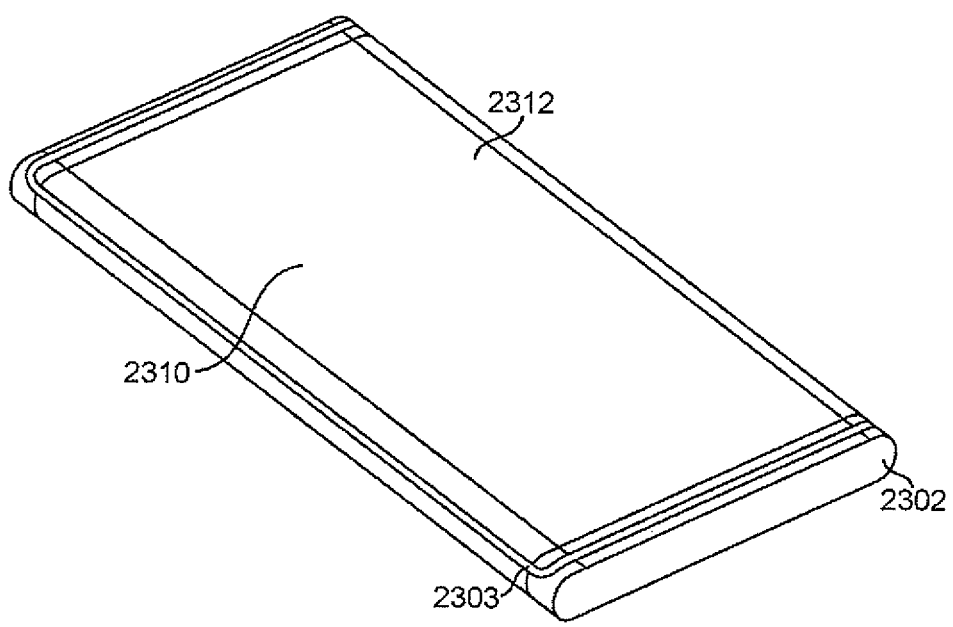
FIG. 23 shows schematically an isometric view of example speaker apparatus according to another embodiment.

Some alternative embodiments will now be described. FIG. 23 shows a device 2310 comprising a display 2312. This display is a 3-D display. The device 2310 comprises a device body 2302, and a bellow/gasket 2303 interfacing the display 2312 with the device body 2302.

Figure 24:
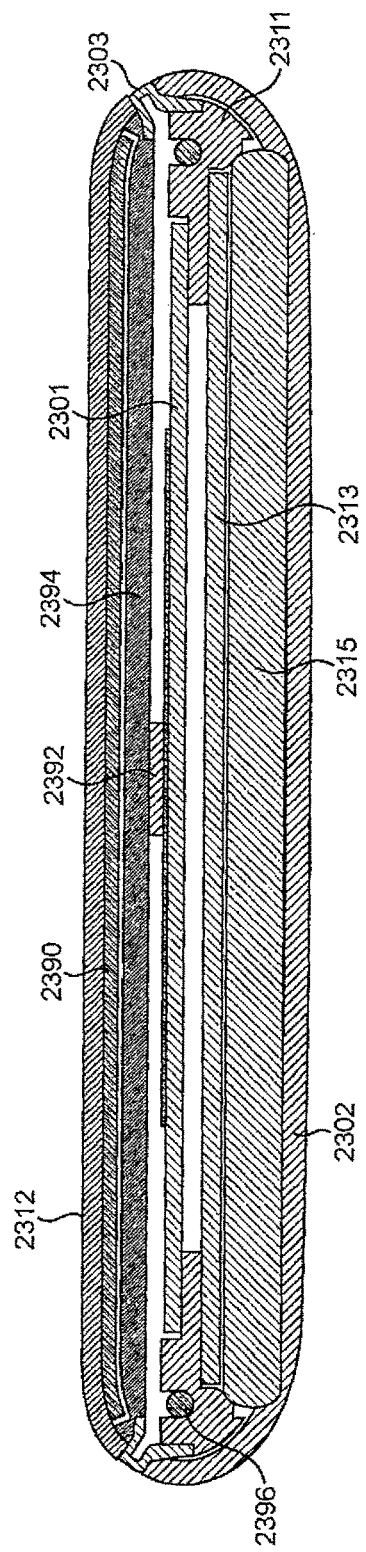
FIGS. 24 and 25 are sectional views of the apparatus of FIG. 23.

FIG. 24 shows a cross-section in the y direction of FIG. 23 (using the same co-ordinate system as described with respect to FIG. 1). This figure shows the 3-D display 2312. The display 2312 comprises a flexible OLED element 2390. A display adapter or damper is shown at 2392, separating a display carrier 2394 from piezo actuator 2301. The flexible bellow is shown at 2303. It can be seen from this figure how the bellow 2303 interfaces the display 2312 and the device body 2302. The chassis is shown at 2311, the battery is shown at 2315, and PWB is shown at 2313. A chassis fixing rod is shown at 2396.

Figure 25:
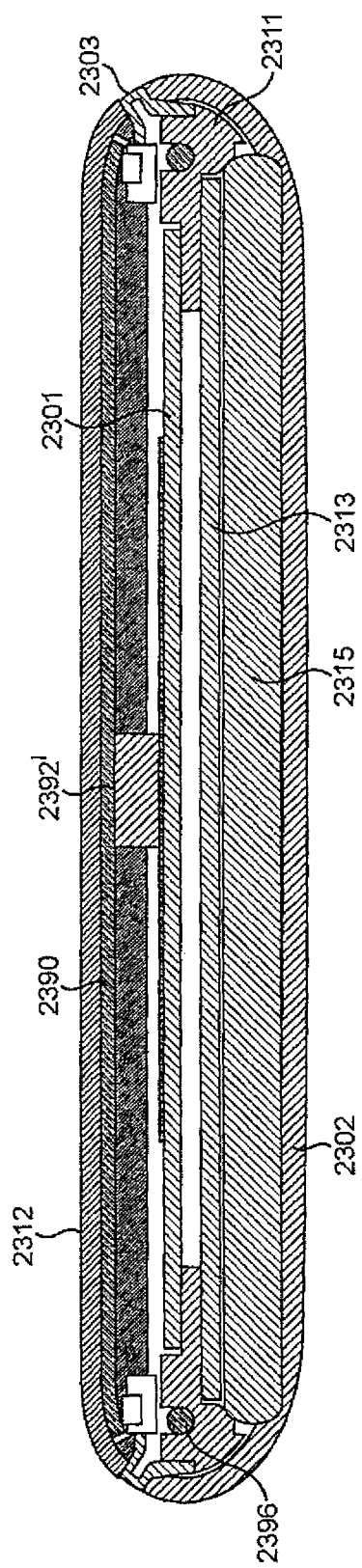

FIG. 25 shows a slight variation on the embodiment of FIG. 24. In the embodiment of FIG. 25, the display carrier 2394 of FIG. 24 is omitted. The display carrier can be omitted for example if the flexible OLED can tolerate some forces to be applied against the rear side of the display. This may result in a lighter construction. The piezo actuator 2301 may also have less mass to move. Accordingly the device can be thinner, and the sensitivity of the speaker may be higher. In FIG. 25, the display adapter 2392' is larger than the display adapter 2392 of FIG. 24.

Figure 26:
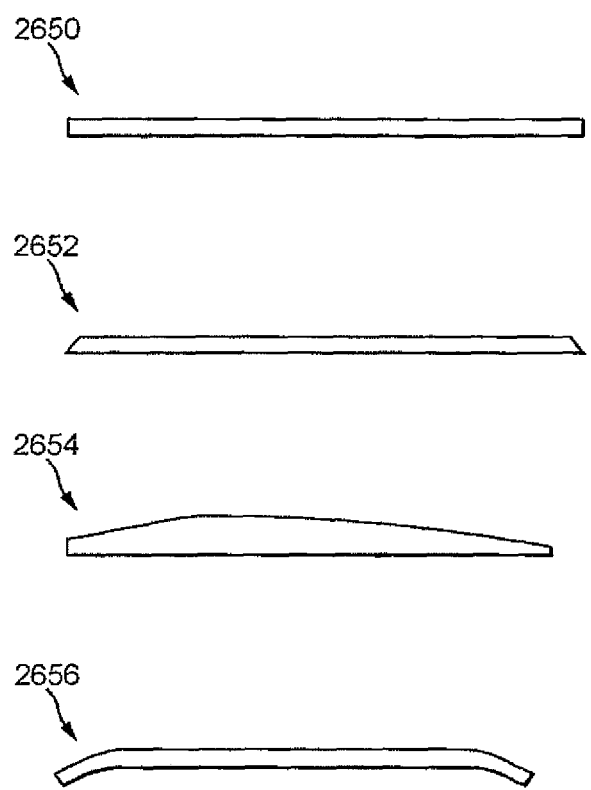
FIG. 26 shows a variety of display types according to some embodiments.

FIG. 26 shows different types of glass (or any other type of suitable material) that may be used for various types of display. A 2-D flat material is shown at 2650. 2.25-D material type is shown at 2652. It will be appreciated that the top side of the material has some shape or profile at the edges, but that the centre of the material is flat. In this embodiment the underside is totally flat. A 2.5-D material type is shown at 2654. The underside is flat but the whole of the topside has curvature. A 3-D material type capable of displaying 3-D images is shown at 2656. Neither the underside or the topside are totally flat. The curvature can be in the y direction only, or in the x direction only, or curvature can be in both the x and y directions.

Figure 27:
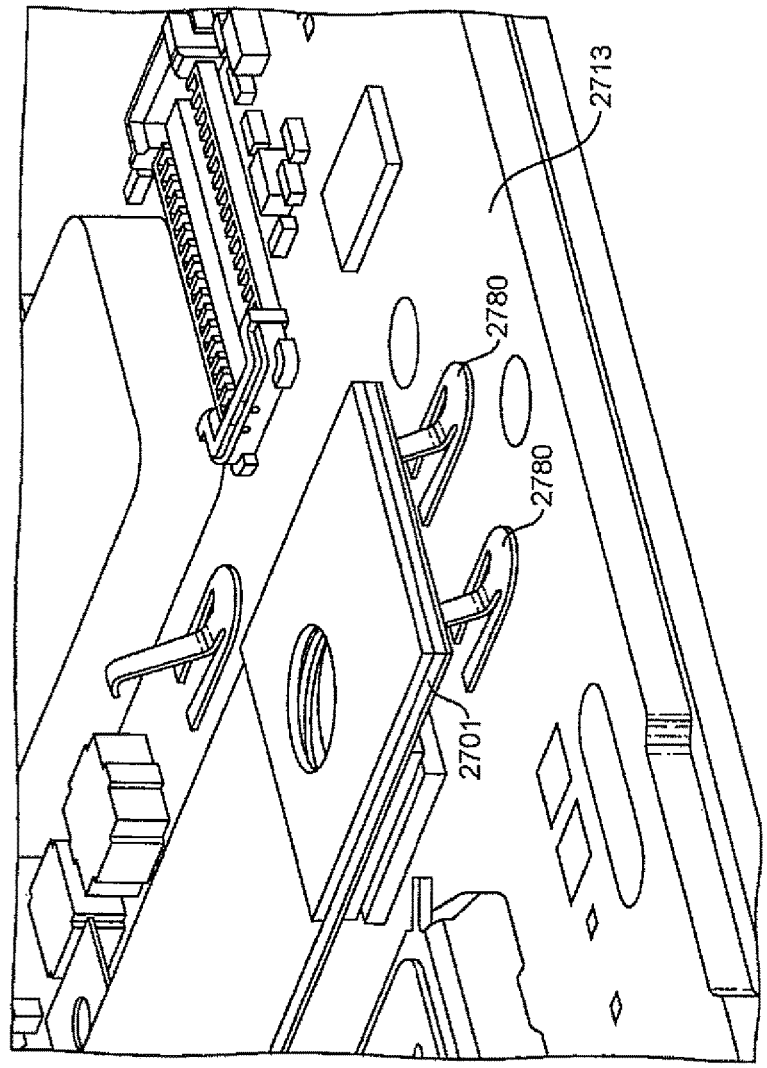
FIGS. 27 to 29 show a spring-clip arrangement for connecting certain components according to some embodiments.
Figure 28:
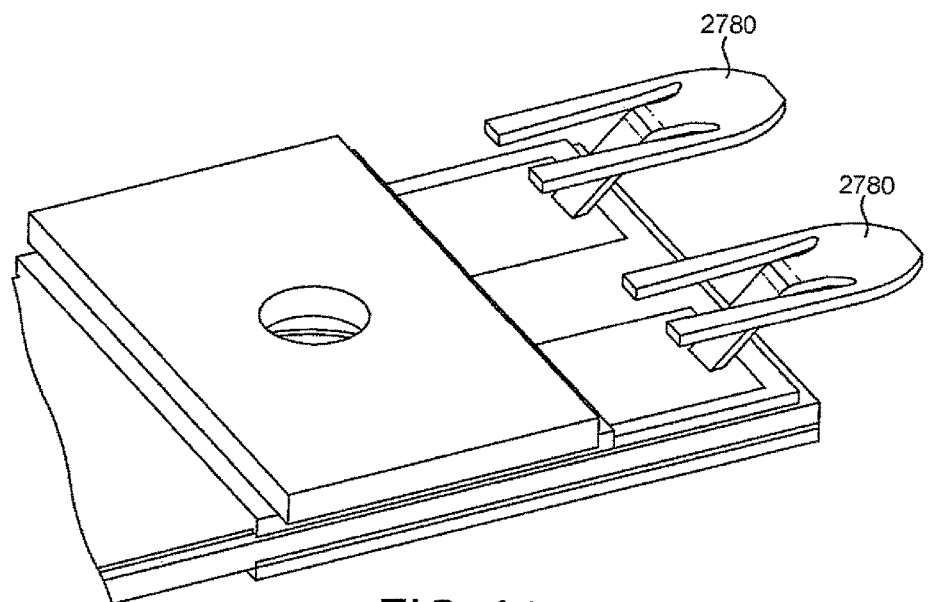
Figure 29:
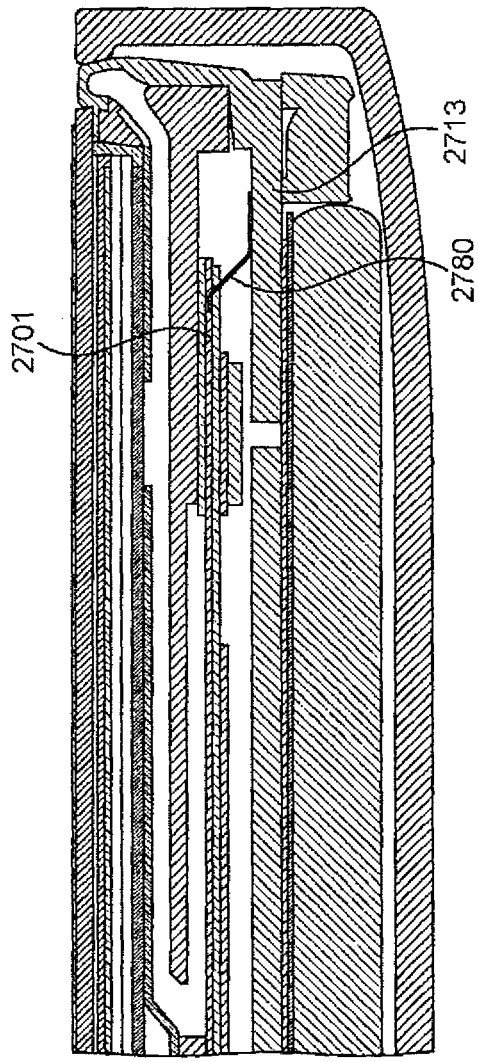

FIGS. 27 to 29 show spring clips 2780 for connecting the PWB 2713 with the piezo FPC 2701. In this particular embodiment, two spring clips 2780 are used, however it will be appreciated that any number of spring clips can be used. The piezo FPC 2701 accommodates the piezo actuator and may also provide electrical connectivity to the PWB. This type of electrical connection provided by the piezo FPC is simple to assemble, and is robust. It may also be advantageous from a tolerance point of view. In example embodiments the contact point of the spring clips may be provided in the non-moving area of the FPC, meaning it will not harm the performance of the piezo actuators.

Figure 30:
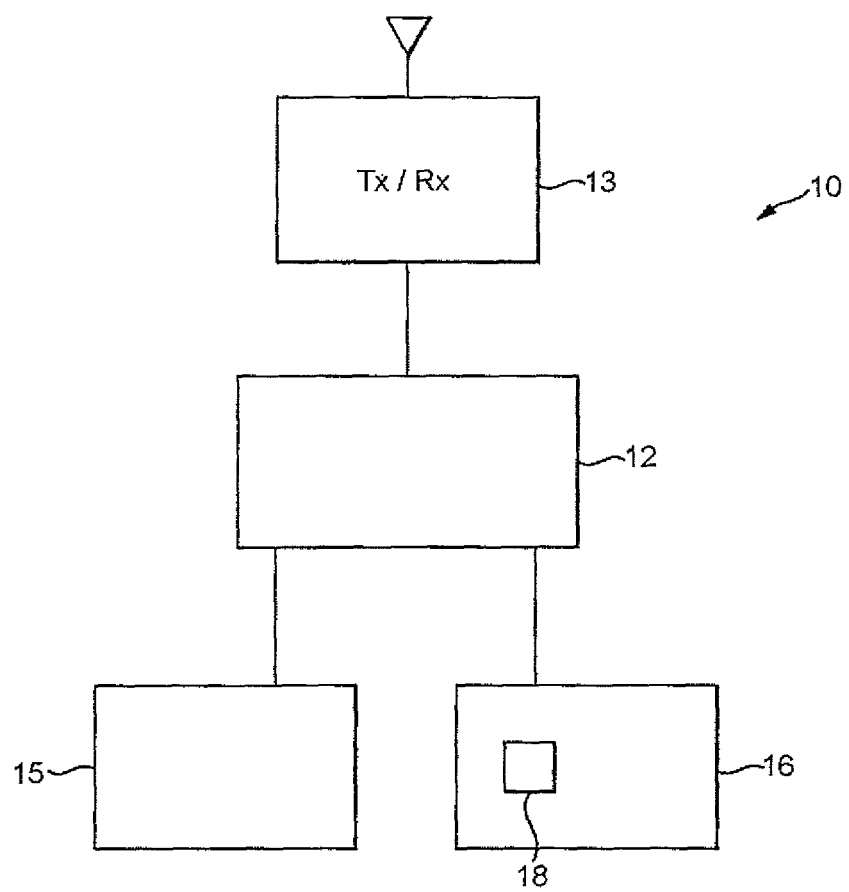
FIG. 30 schematically shows some hardware features of an example user equipment according to some embodiments.

As shown schematically in FIG. 30, in some embodiments the apparatus comprises a processor 15. The processor 15 can be linked to the display 12. The apparatus in some embodiments comprises a transceiver (or a receiver or a transmitter) such as for example a cellular, Wi-Fi, Bluetooth or other suitable radio frequency transceiver. In such embodiments the processor is further linked to the transceiver (TX/RX) 13 and to a memory 16.

The processor 15 can in some embodiments be configured to execute various program codes. The implemented program codes, in some embodiments can comprise such routines as touch processing, input simulation, or tactile effect simulation code where the touch input module inputs are detected and processed, effect feedback signal generation where electrical signals are generated which when passed to a transducer can generate tactile or haptic feedback to the user of the apparatus, or actuator processing configured to generate an actuator signal for driving an actuator. The implemented program codes can in some embodiments be stored for example in the memory 16 and specifically within a program code section 17 of the memory 16 for retrieval by the processor 15 whenever needed. The memory 16 in some embodiments can further provide a section 18 for storing data, for example data that has been processed in accordance with the application, for example pseudo-audio signal data.

The apparatus 10 can in some embodiments be capable of implementing processing techniques at least partially in hardware, in other words the processing carried out by the processor 15 may be implemented at least partially in hardware without the need of software or firmware to operate the hardware.

The transceiver 13 in some embodiments enables communication with other electronic devices, for example in some embodiments via a wireless communication network.

It shall be appreciated that the term user equipment is intended to cover any suitable type of wireless user equipment, such as mobile telephones, portable data processing devices or portable web browsers. Furthermore, it will be understood that the term acoustic sound channels is intended to cover sound outlets, channels and cavities, and that such sound channels may be formed integrally with the transducer, or as part of the mechanical integration of the transducer with the device.

In general, the design of various embodiments of the invention may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

The design of embodiments of this invention may be implemented by computer software executable by a data processor of the mobile device, such as in the processor entity, or by hardware, or by a combination of software and hardware. Further in this regard it should be noted that any blocks of the logic flow as in the Figures may represent program steps, or interconnected logic circuits, blocks and functions, or a combination of program steps and logic circuits, blocks and functions. The software may be stored on such physical media as memory chips, or memory blocks implemented within the processor, magnetic media such as hard disk or floppy disks, and optical media such as for example DVD and the data variants thereof, CD.

The memory used in the design of embodiments of the application may be of any type suitable to the local technical environment and may be implemented using any suitable data storage technology, such as semiconductor-based memory devices, magnetic memory devices and systems, optical memory devices and systems, fixed memory and removable memory. The data processors may be of any type suitable to the local technical environment, and may include one or more of general purpose computers, special purpose computers, microprocessors, digital signal processors (DSPs), application specific integrated circuits (ASIC), gate level circuits and processors based on multi-core processor architecture, as non-limiting examples.

Embodiments of the inventions may be designed by various components such as integrated circuit modules.

As used in this application, the term 'circuitry' refers to all of the following:
- (a) hardware-only circuit implementations (such as implementations in only analog and/or digital circuitry) and
- (b) to combinations of circuits and software (and/or firmware), such as: (i) to a combination of processor(s) or (ii) to portions of processor(s)/software (including digital signal processor(s)), software, and memory(ies) that work together to cause an apparatus, such as a mobile phone or server, to perform various functions and
- (c) to circuits, such as a microprocessor(s) or a portion of a microprocessor(s), that require software or firmware for operation, even if the software or firmware is not physically present.

This definition of 'circuitry' applies to all uses of this term in this application, including any claims. As a further example, as used in this application, the term 'circuitry' would also cover an implementation of merely a processor (or multiple processors) or portion of a processor and its (or their) accompanying software and/or firmware. The term 'circuitry' would also cover, for example and if applicable to the particular claim element, a baseband integrated circuit or applications processor integrated circuit for a mobile phone or similar integrated circuit in server, a cellular network device, or other network device.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

The invention claimed is:

1. A method comprising:
   providing a case;
   providing a display assembly;
   connecting the display assembly to the case via a flexible gasket, the display assembly connected to a chassis being located to form an air gap between the chassis and the display assembly;
   allowing the display assembly to move with respect to the case based on the flexible gasket;
   providing at least one vibrating element configured to actuate the chassis to move the display assembly relative to the case to generate at least one of: acoustic waves; or haptic/tactile effect; wherein the case, the display assembly, the flexible gasket, and the at least one vibrating element at least partially form a speaker;
   providing a transceiver located within an internal volume of the speaker; and
   providing at least one hole which is coupled to the internal volume for permitting equalization of internal and external pressure of the speaker.

2. The method as claimed in claim 1, wherein the at least one vibrating element comprises at least one piezo actuator.

3. The method as claimed in claim 1, wherein the flexible gasket comprises a suspension part coupled at one end to the case and at another end to the display assembly, wherein the suspension part is configured to suspend the display assembly relative to the case with a bending force of the suspension part.

4. The method as claimed in claim 3, wherein the suspension part is a resilient folded surface, configured to suspend the display assembly relative to the case with a bending force of the resilient folded surface.

5. The method as claimed in claim 1 wherein the flexible gasket comprises at least one of:
   a first support part configured to lock the flexible gasket position within the speaker so as to provide a fixed suspension in the direction of movement of the display assembly; or
   a second support part configured to form a part of a display support.

6. The method as claimed in claim 1, wherein actuating the display assembly comprises motion of at least one of:
   a display element; or
   a display window.

7. The method as claimed in claim 1 wherein a display support is configured to allow motion of the display assembly in at least one direction and configured to mechanically limit the motion of the display assembly in the at least one direction.

8. The method as claimed in claim 1, further comprising providing at least one further internal component, wherein the at least one further internal component comprises:
   at least one camera;
   at least one microphone;
   at least one data socket;
   at least one power socket;
   a printed wiring board;
   a printed circuit board;
   a SIM assembly;
   an input key or button;
   a camera flash;
   a battery; and
   a battery frame.

9. The method as claimed in claim 1, wherein the at least one hole comprises:
   a breathing hole;
   a AV jack hole;
   a USB hole;
   a power port configured to receive a power plug; and
   a data port configured to receive a data plug.

10. The method as claimed in claim 1, wherein the internal volume of the speaker is at least one of:
    divided with at least one internal component to provide a tuned frequency response for the speaker; or
    formed at least based on internal surfaces of the case, the display assembly and the flexible gasket.

11. The method as claimed in claim 1, wherein the at least one vibrating element is configured to move the display assembly relative to the case to generate a haptic feedback.

12. The method as claimed in claim 1, wherein the transceiver is at least one of:
    a radio frequency transmitter;
    a radio frequency receiver; or
    a cellular engine.

13. The method as claimed in claim 1, wherein the display assembly comprises at least one of:
- a display component; or
- a display window.

14. The method as claimed in claim 1, wherein the at least one vibrating element is configured to actuate the display assembly with at least one of:
- a direct coupling between the at least one vibrating element and the display assembly; or
- an indirect coupling between the at least one vibrating element and the display assembly.

15. The method as claimed in claim 6, wherein the flexible gasket is configured to at least one of:
- provide a functionality of suspension similar to a surround of a conventional loudspeaker;
- substantially surrounds a periphery of the display assembly; or
- provide a tuned performance for at least one of: an acoustic output or a haptic feedback response.

16. The method as claimed in claim 15, wherein the tuned performance is based on at least one of:
- a shape of the flexible gasket;
- a material of the flexible gasket; or
- dimensions of the flexible gasket.

17. The method as claimed in claim 1, wherein the case comprises at least one of:
- a unibody case; or
- a multiple part case.

18. The method as claimed in claim 2, wherein the at least one vibrating element is configured to transfer vibrations to the chassis at edge portions of the at least one vibrating element, and configured to transfer vibrations to a display support at center portions of the at least one vibrating element.

* * * * *